United States Patent

Prevotat et al.

[11] Patent Number: 5,980,721
[45] Date of Patent: Nov. 9, 1999

[54] FABRICATION METHOD FOR DOUBLE METALLIC RESIST PRINTED CIRCUIT BOARDS

[75] Inventors: Olivier Prevotat, Buc; Jean-André Lhermitte, Chatenay Malabry, both of France

[73] Assignee: Thomson-CSF, Paris, France

[21] Appl. No.: 09/021,166

[22] Filed: Feb. 10, 1998

[30] Foreign Application Priority Data

Feb. 11, 1997 [FR] France .................................. 97 01557

[51] Int. Cl.⁶ ....................................................... C25D 5/02
[52] U.S. Cl. ............................ 205/125; 205/920; 427/96; 427/97
[58] Field of Search .................................. 205/125, 126, 205/920; 427/96, 97

[56] References Cited

U.S. PATENT DOCUMENTS 4,312,897 1/1982 Reimann ..................... 427/96
4,487,654 12/1984 Coppin ......................... 216/18

Primary Examiner—Kathryn Gorgos
Assistant Examiner—Wesley A. Nicolas
Attorney, Agent, or Firm—Oblon, Spivak, McClelland, Maier & Neustadt, P.C.

[57] ABSTRACT

In a method to fabricate a printed circuit having a surface plated with a base metal layer, an improvement including depositing a first metallic resist on the base layer to delimit at least patterns of circuit elements to be etched in a layer having a first thickness, forming metallized holes in the plated surface after depositing the first metallic resist; and depositing a second metallic resist after forming the metallized holes to delimit at least patterns of circuit elements to be etched in a layer having a second thickness greater than said first thickness, whereby more accurate etching in the metal layer having the first thickness compared to etching in the metal layer having the second thickness is possible.

15 Claims, 11 Drawing Sheets

FABRICATION METHOD FOR DOUBLE METALLIC RESIST PRINTED CIRCUIT BOARDS

BACKGROUND OF THE INVENTION

The present invention relates to a fabrication method for double-photoresist printed circuits. It is notably applicable to the fabrication of circuits with metallized holes when a high level of etching precision is required. More generally, it is applicable to circuits with patterns that must be etched with high precision in addition to patterns requiring substantial metal thickness. It is also applicable in cases where two different finishes are necessary for the wiring of components.

DESCRIPTION OF THE PRIOR ART

Certain applications, such as microwave functions, demand a very high precision etching of printed circuits. For example, boards used in microwave filtering functions carry juxtaposed tracks whose widths and the inter-track distances must respect very fine tolerances. Other applications also necessitate very precise etching, notably when spaces must be left for components, which implies precise wiring and positioning of these spaces relative to the tracks and other components. All such circuits require metallized holes for the connection of components or discrete functions or for interconnection with other sub-assemblies or printed circuits.

Regarding the fabrication of printed circuits with metallized holes, at least two types of methods are known. The first is the so-called "additive" type since it involves addition of copper: the base material is metallized selectively. In the second type of method, known as the "removal" type, the base material is first entirely covered by a metallic leaf which is then etched selectively, for example copper is etched from the base copper. Two variants of the removal-type method are known as "panel plating" (metallization of the panel) and "pattern plating" (metallization of the pattern).

The "pattern plating" method has the main advantage that the final copper electroplating is carried out only on the electronic circuits. The thickness of copper to etch is therefore limited to the thickness of base copper to which is added the thickness of the first metallic deposit. Unfortunately, large variations in the thickness of metal applied during the first deposit of copper are common. Consequently, dense sections of the circuit are covered with less metal than less dense sections, with the result that the less-covered parts tend to be over-etched.

The main disadvantage of the "panel plating" method is that the thickness of copper to etch, for an equal thickness of copper in the holes, is greater than in the case of application of the "pattern plating" method. Also, if a photosensitive product of the so-called "negative" type is used, the parts of the film exposed to light being polymerized and therefore persistent on the circuit after development, this film is stretched above the metallized holes to protect them from the etching agent. There is then a risk of undesirable etching of the copper in the holes if the film photosensitive breaks, whereas this risk is avoided in the "pattern plating" method since in this case there is no longer any photosensitive film at the time of etching.

In the case of the "pattern plating", to metallize the holes, it is indispensable to deposit a metallic layer several microns thick, typically 5 $\mu$m, over the whole surface of the panel. To make the holes conducting, a very fine layer of metal is deposited in a so-called "chemical" manner, this layer being immediately covered with a second layer of metal deposited in a so-called "electrolytic" manner. Since the chemical deposition cannot be made selectively, even in the case of "pattern plating" the thickness of metal to etch is greater than the thickness of the base metal.

In the case of use of a removal method, the etching precision is directly dependent on the thickness of the copper being etched. If high precision is required in the outline of the circuits, the thicknesses of the metallic deposits must be minimized. However, a reduction in thickness means that the thickness of metal in the metallized holes is also reduced, which tends to reduce the reliability of the printed circuit since the ability of the metallized holes to resist thermo-mechanical stresses is directly related to the thickness of the metal deposit.

The additive method overcomes the problems related to the etching precision, but it does not provide sufficient adherence of the copper on the substrate for applications in which the latter is subject to severe thermal and/or mechanical stresses. This method is also rather difficult to implement in practice and is therefore much less widely used than the removal method.

SUMMARY OF THE INVENTION

The object of the present invention is to overcome the disadvantages described previously. In particular, the invention provides for a high degree of etching precision without limitation of the thickness of metal deposited in the holes.

For this purpose, the invention is a fabrication method for a printed circuit, wherein the surface of the circuit is first plated with a base metal layer which is followed by at least two metallization operations, during the first operation a first metallic photoresist being deposited on said base layer delimiting at least the patterns of the circuit elements requiring high-precision etching, during the second operation the patterns of other circuit elements being defined by application of a second metallic photoresist, any required metallized holes being made between said two metallization operations.

The main advantages of the invention are that it enables a mix of different types of components and wiring technologies, that it is adaptable to digital circuits (whose operating frequency is increasing with technological progress), that it is adaptable to microwave circuits, that it is adaptable to printed circuits providing both microwave and digital functions, that it is applicable to single-layer and multi-layer circuits and that it is easy to implement.

BRIEF DESCRIPTION OF THE DRAWINGS

Other characteristics and advantages of the present invention will appear on reading the description below of a preferred embodiment with reference to the appended drawings, in which.

DESCRIPTION OF A PREFERRED EMBODIMENT

Figure 1:
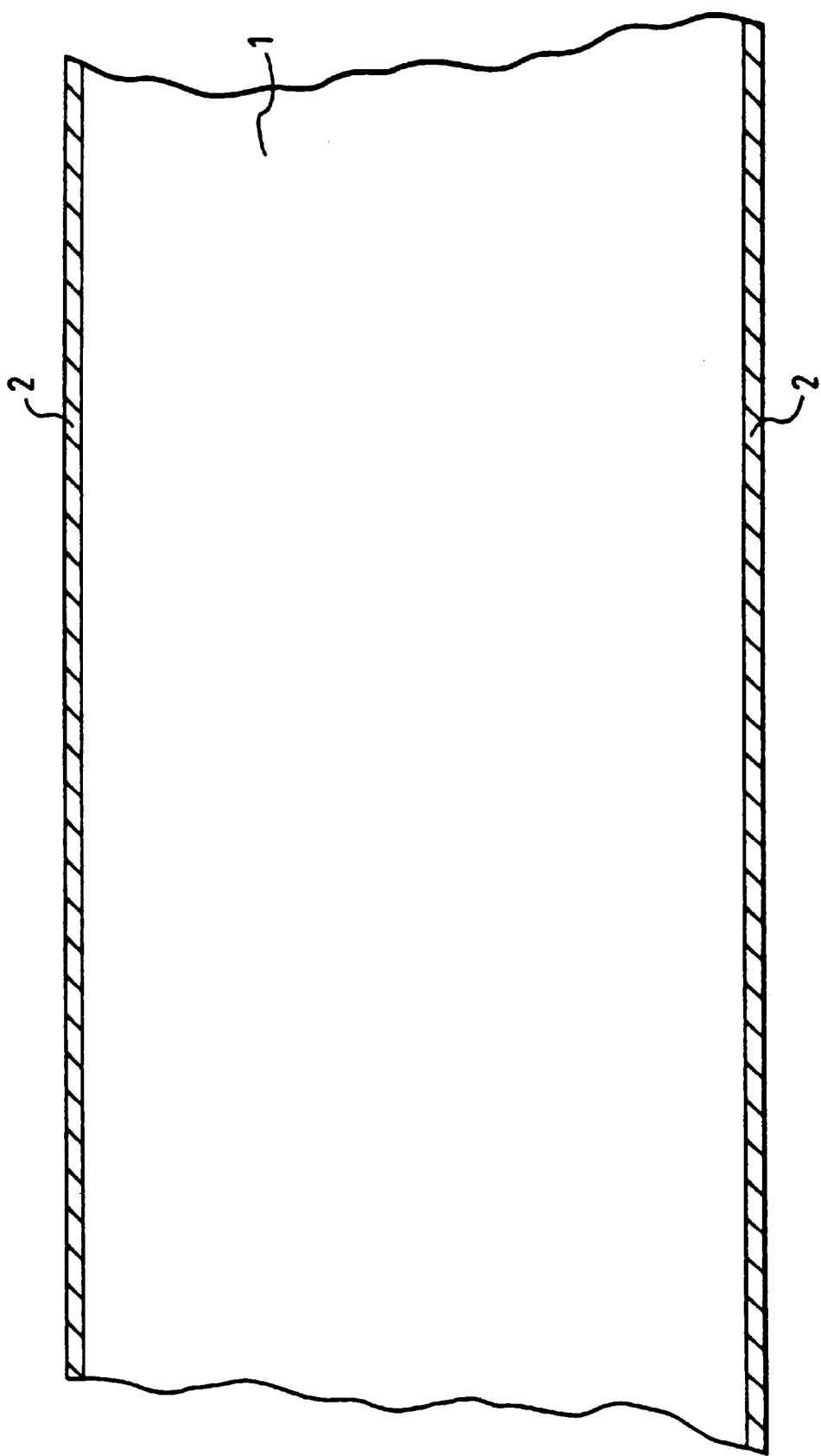
FIGS. 1 to 10 illustrate an example of a possible series of stages in the method according to the invention, applied to the fabrication of a double-face printed circuit board, taken as an example.

FIG. 1 shows a sectional view of part of a sheet of dielectric material 1 plated on both faces with a copper base layer 2, said sheet being destined to be used for the fabrication of a printed circuit, for example a double-face circuit board. Unless indicated otherwise, we shall always reference these same parts by the same numbers 1 and 2 in our description of an embodiment of the method according to the invention.

Figure 2:
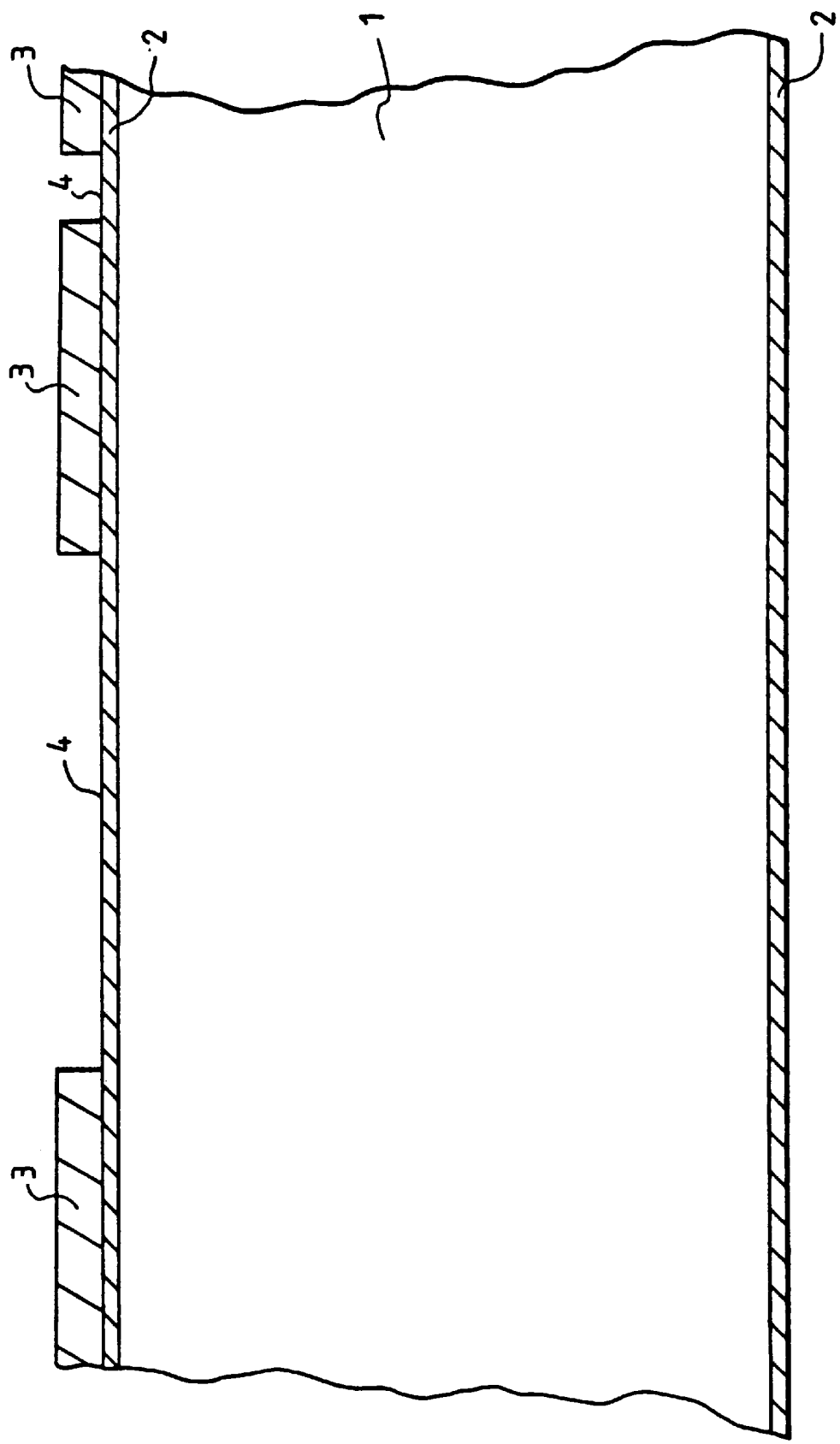

FIG. 2 illustrates a first stage of the method according to the invention. The base layer 2 is covered with a photosensitive product 3 said to be "negative". It is of course possible to use a "positive" photosensitive product or any other product that can be deposited selectively, such as a product suitable for serigraphy. The parts of the surface 4 on which high-precision etching is required are the only parts to which an insulation is not applied, so that after the development of the photosensitive product these parts 4 are not covered with a film 3. This film protects the parts not concerned by the precision etching during operations carried out in the next two stages. The parts of surface 4 destined for high-precision etching are, for example, reserved component areas or tracks related to microwave and/or digital functions.

Figure 3:
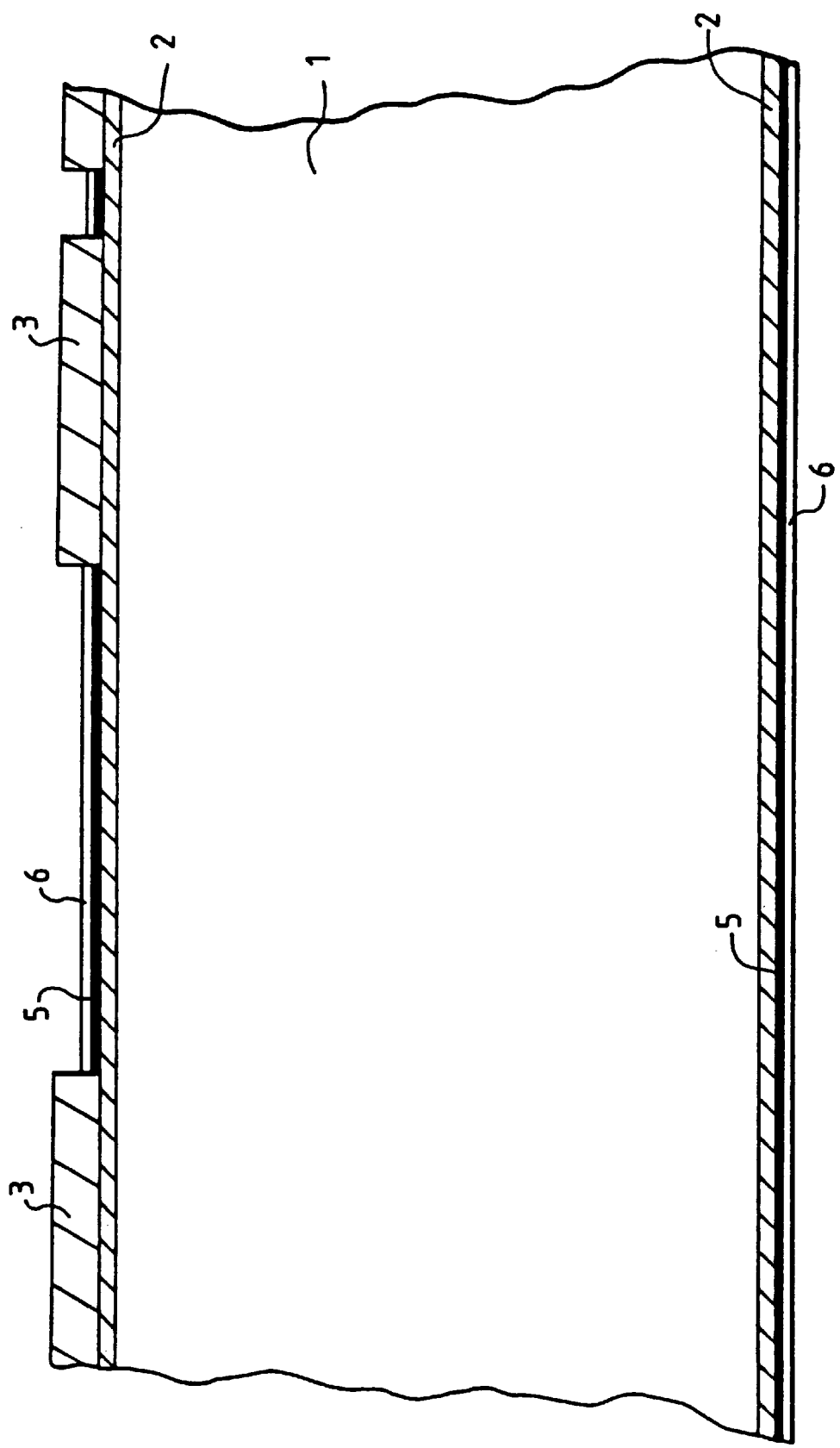

FIG. 3 illustrates the second and third stages of the method according to the invention. In the second stage, the surface requiring high-precision etching is covered with a layer of gold 5 by electroplating. In the third stage, the deposited layer of gold 5 is covered, for example, by a layer of copper 6 by electroplating. One advantage of covering the layer of gold 5 by the layer of copper 6 is that this enables other operations, for example the preparation of other surfaces, without risk of damaging the gold.

Figure 4:
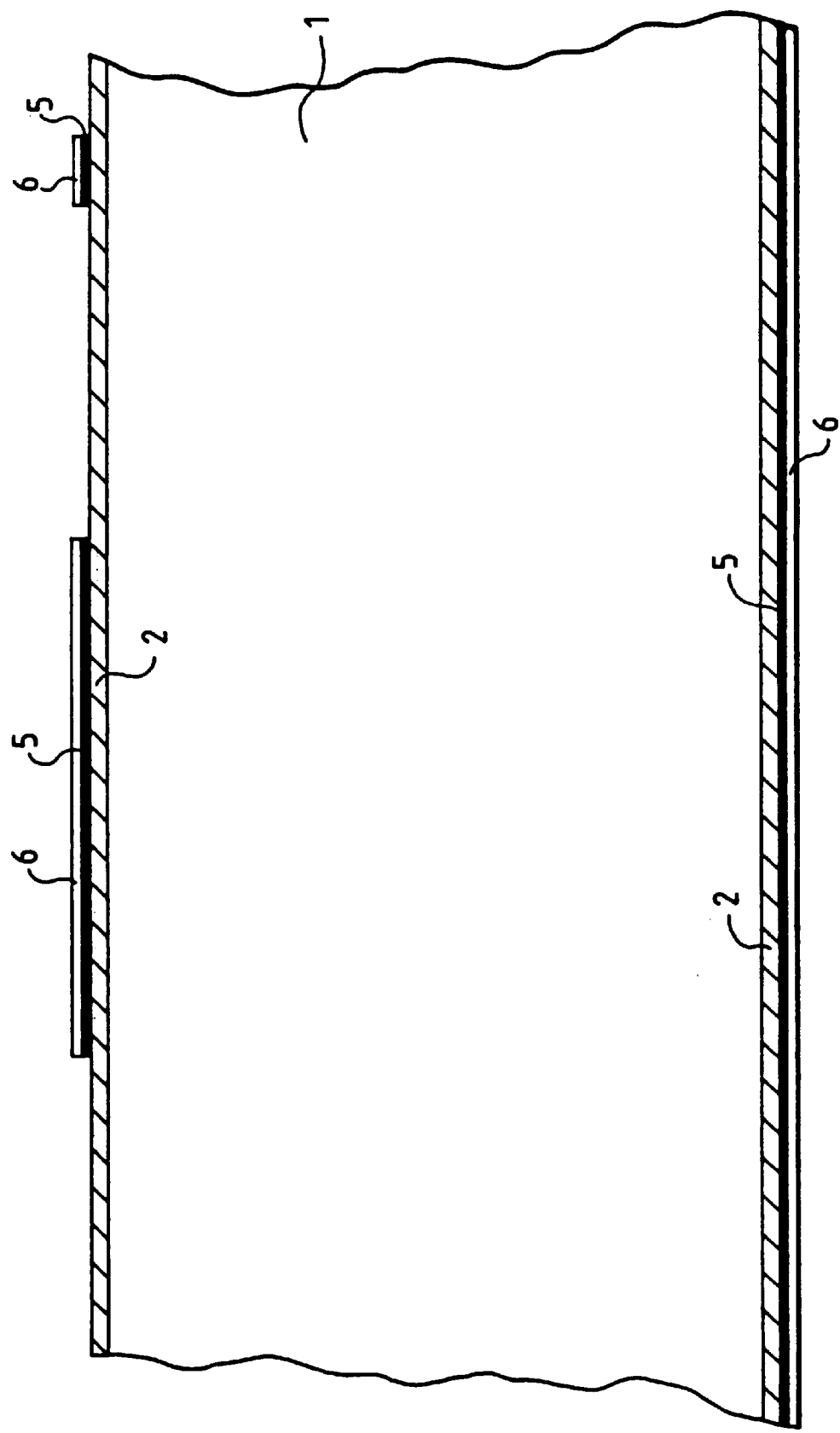

FIG. 4 illustrates a fourth stage of the method according to the invention in which the photosensitive product is eliminated from the surface of the printed circuit.

Figure 5:
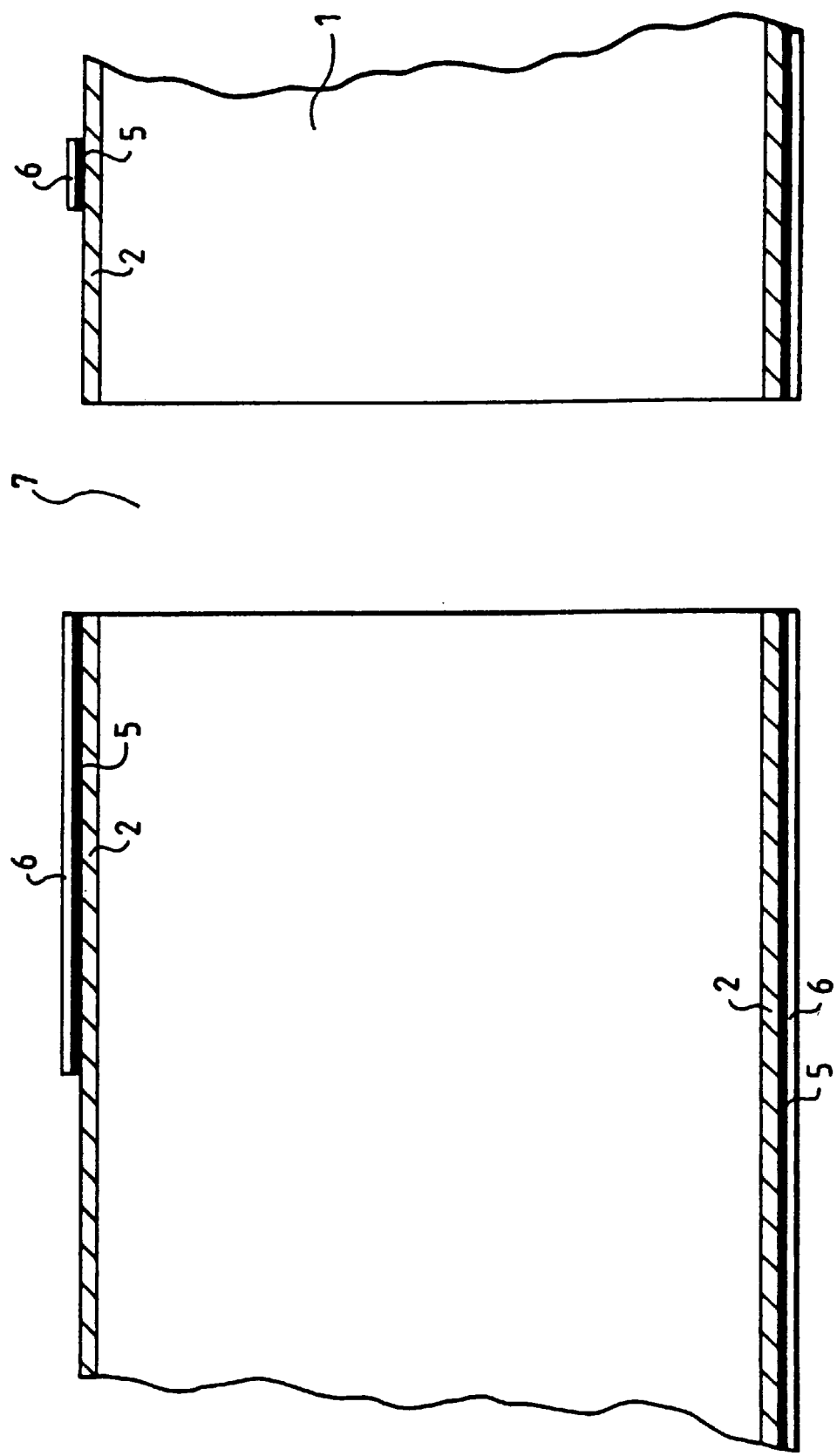

FIG. 5 illustrates a fifth stage in which the required holes 7 are made.

Figure 6:
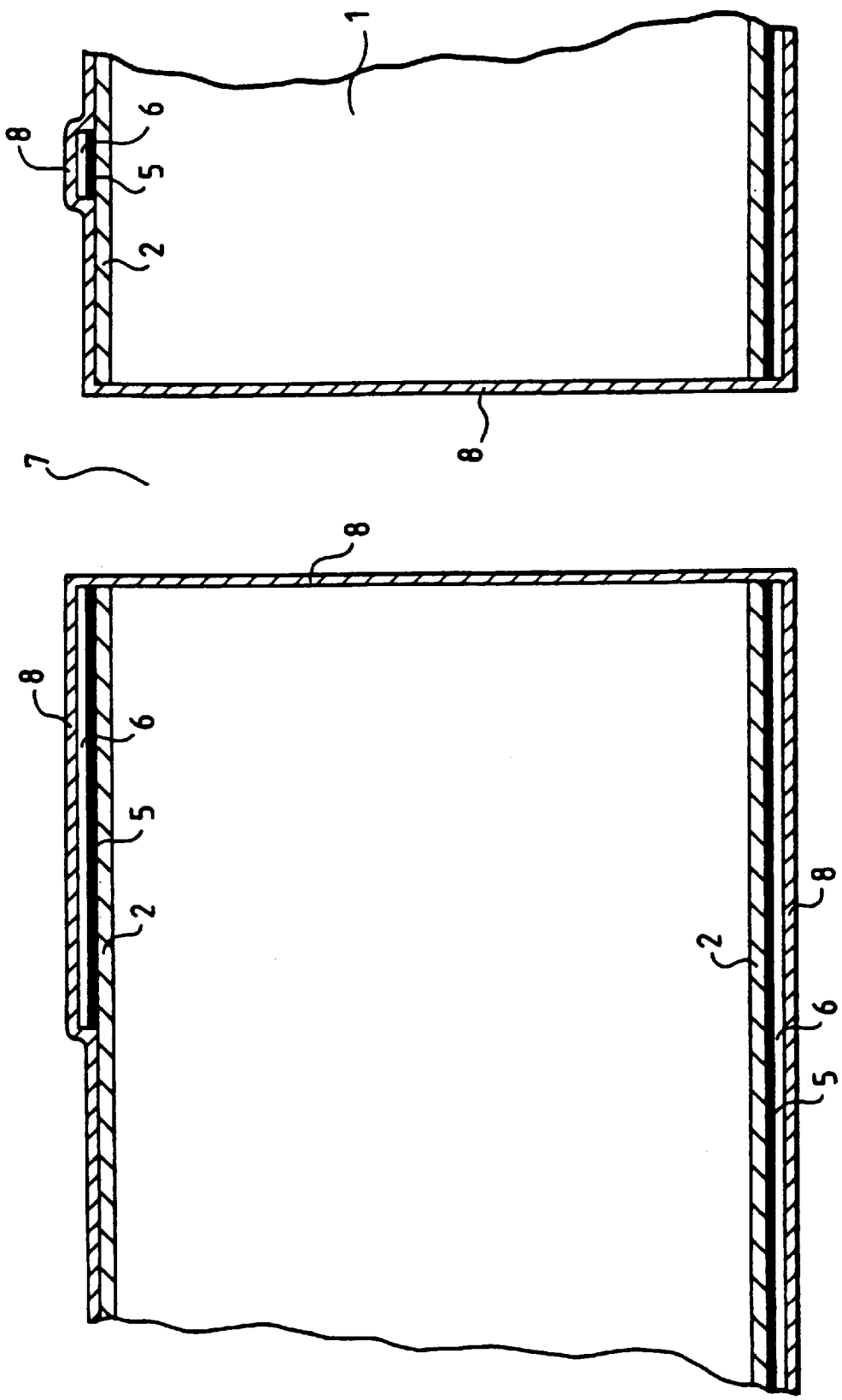

FIG. 6 illustrates a sixth stage of the method. In this stage, all the surface including that within the holes 7 and that destined for high-precision etching is covered chemically with a copper deposit then a copper electroplating 8. The chemical deposition of copper preceding the electrolytic deposition of copper is necessary due to the fact that electroplating is not possible directly on a dielectric material, this being an electrical insulator. On the other hand, the chemical deposition alone cannot provide a satisfactory layer of copper owing to lack of mechanical strength. Moreover, chemical deposition cannot be selective, unlike electroplating for which selection of the surfaces to be electroplated is achieved by masking. The total thickness of the chemical deposit and electroplating can be of the order of 5 µm, for example.

Figure 7:
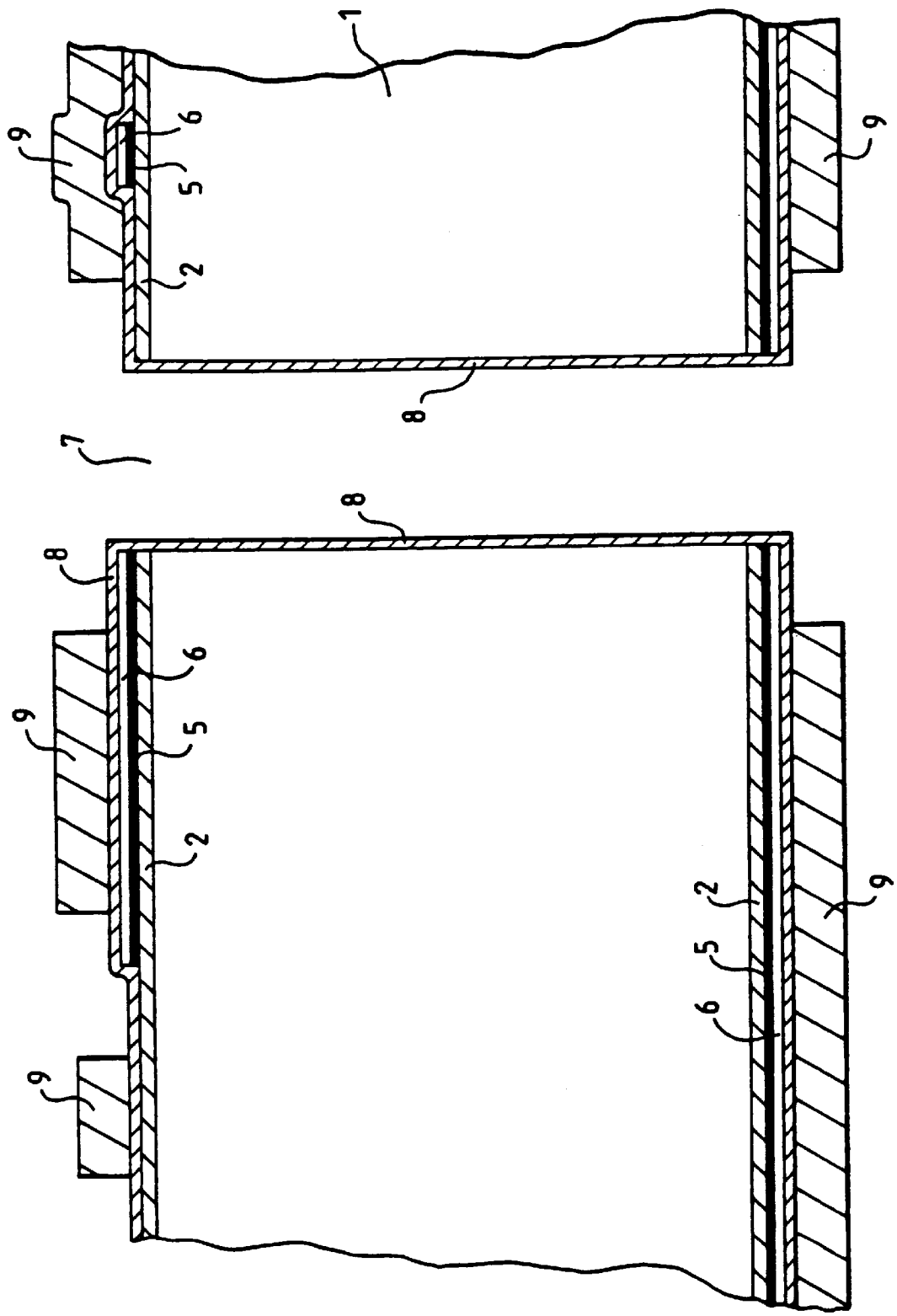

FIG. 7 illustrates a seventh stage of the method according to the invention. A protective product 9, for example a negative photosensitive film, is placed so as to cover the requiring high-precision etching sections, defining for example reserved component areas and their associated connections, and tracks and spaces of very precise dimensions. To do this, after placing a photosensitive product, these surfaces become insulated, after development, by a covering of polymerized photosensitive film 9. This insulation is not carried out on connection pads (donuts) of the metallized holes nor on other circuit elements requiring of large thicknesses of metal such as certain reserved component areas or power lines.

Figure 8:
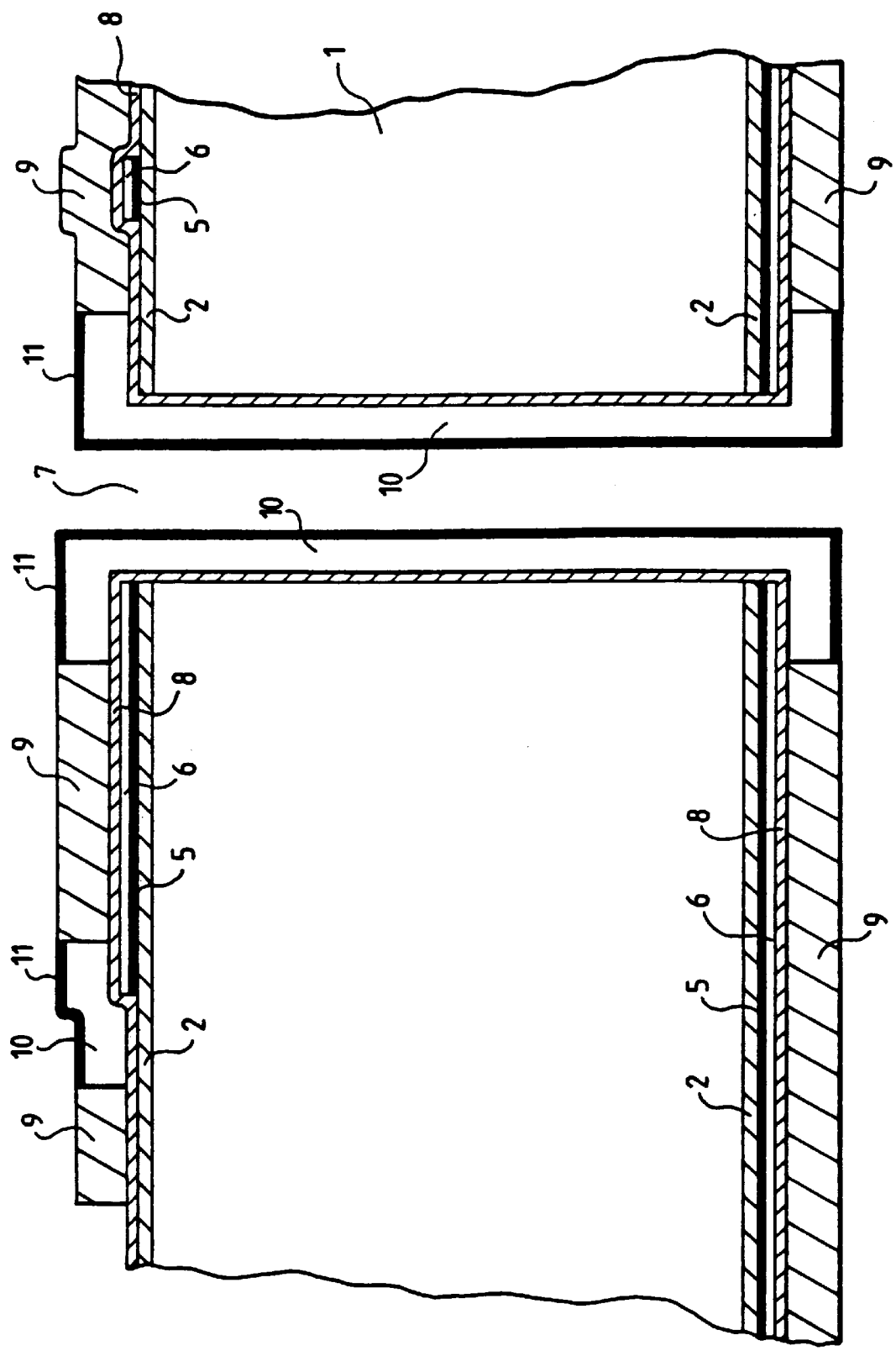

FIG. 8 illustrates an eighth stage of the method according to the invention. In this stage, after the development of the photosensitive product 9, at least one layer of copper 10 is deposited by electroplating on the surfaces not covered by photosensitive film. The thickness of the deposit can be about 25 µm, for example. An electroplating 11 of a metal serving as the etching mask can be made on the previous layer 10, this layer 11 serving for example as a second finishing layer, the first finishing layer being the metal layer 5. This layer 11 is of tin-lead, gold or tin, for example.

Figure 9:
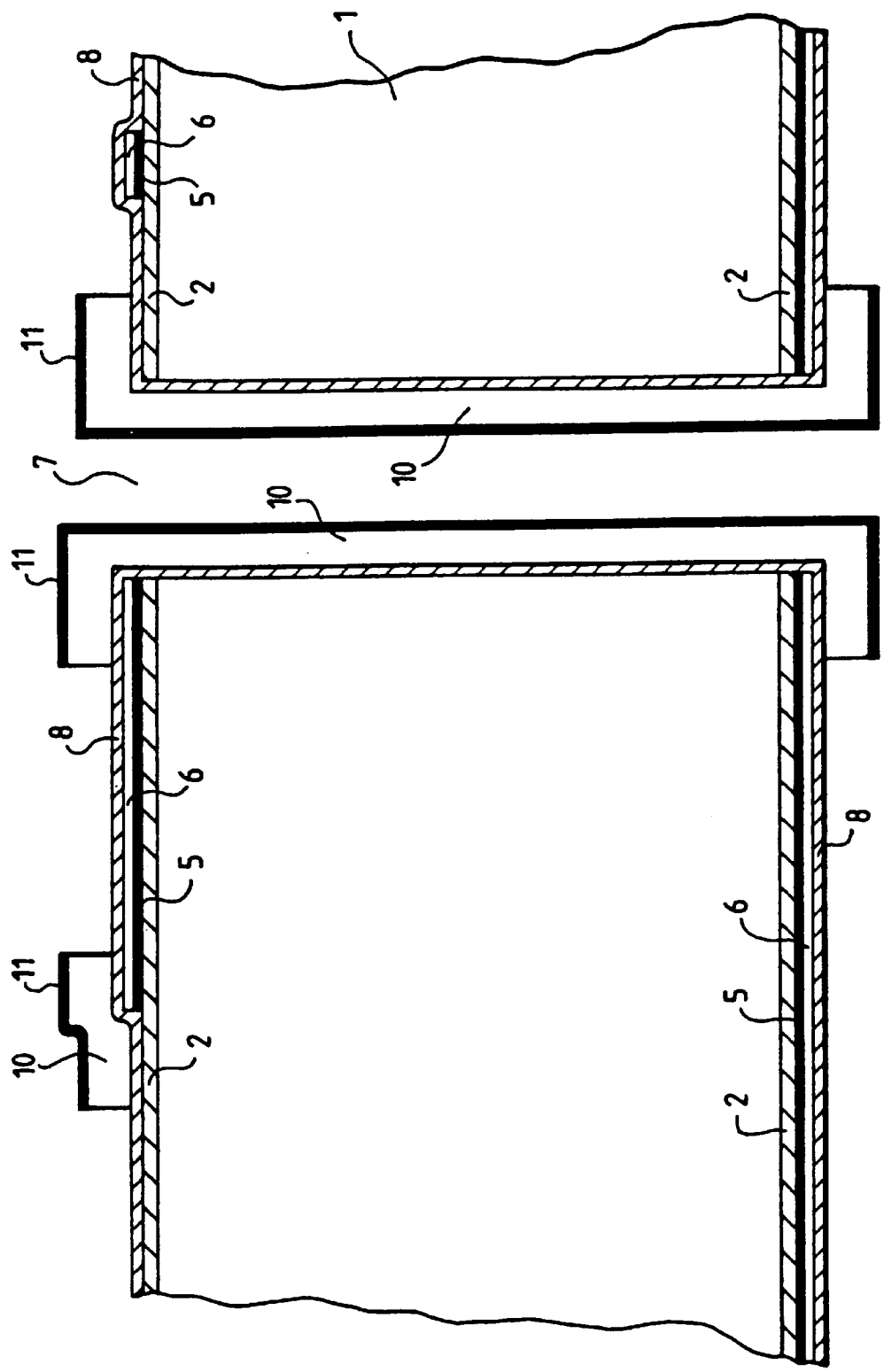

FIG. 9 illustrates a ninth stage of the method according to the invention in which the polymerized photosensitive film 9 is removed.

Figure 10:
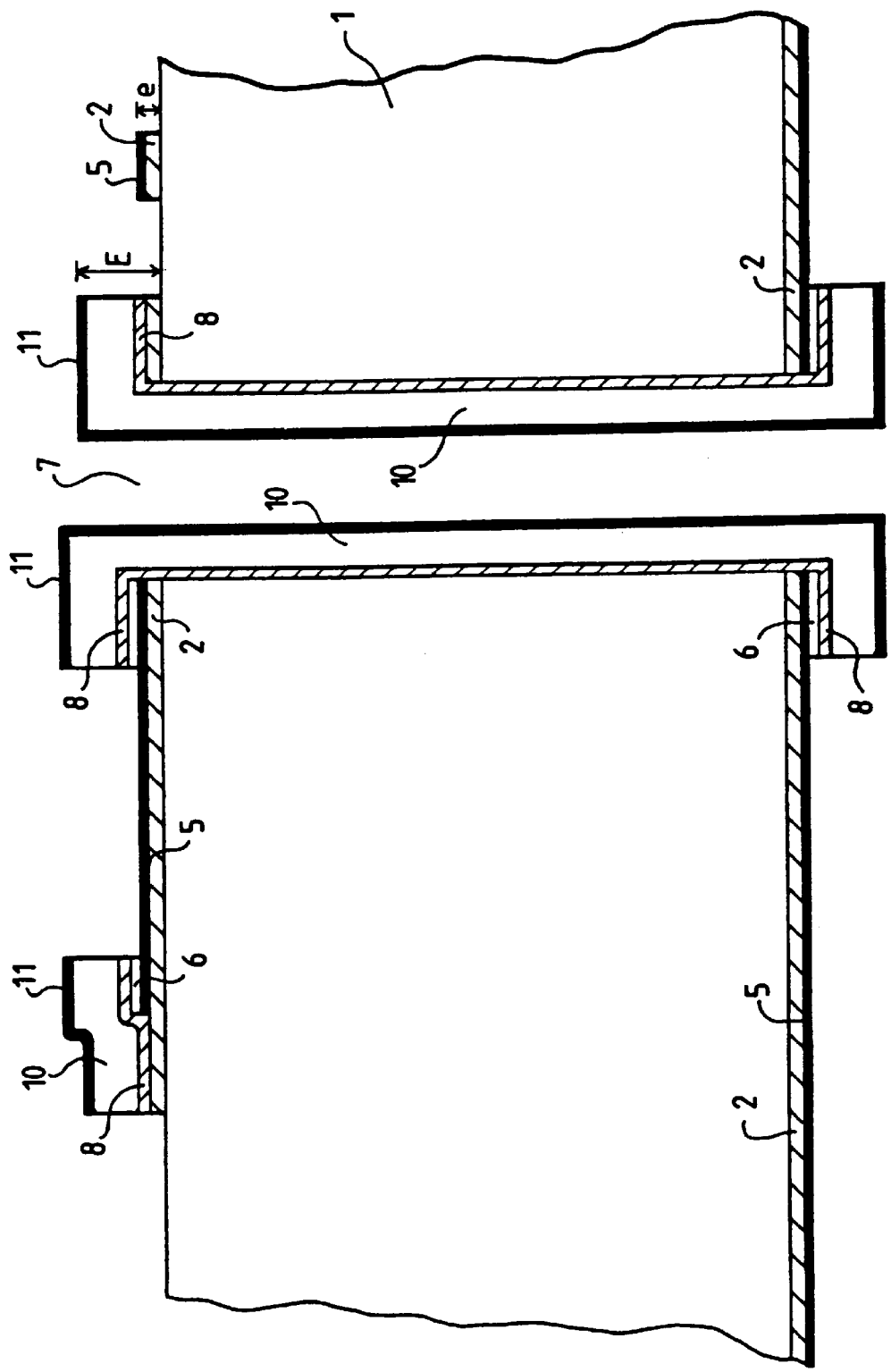

FIG. 10 illustrates the last stage, etching, revealing one of the advantages of the method according to the invention, provided notably by its second stage where the surface requiring very precise etching is covered with a layer of gold. At the end of the previous stages, FIG. 10 shows that the thickness e of metal to be etched is small beneath the surfaces covered with the layer of gold 5, the only layer to etch being for example the copper base layer 2. This small thickness enables high-precision etching since this precision depends on the thickness being etched: the thinner the material, the greater the precision. Moreover, the other parts of printed circuits, notably the metallized holes 7 and certain reserved component areas are covered with a layer of metal of larger thickness E. The method therefore provides for both a satisfactory thickness of metal in the metallized holes and high-precision etching of critical circuit elements such as tracks.

In practice therefore, the method according to the invention includes at least two metallization operations so as to obtain at least two metallic photoresists, a photoresist being a protective layer protecting part of the circuit from attack by the etching product. The first photoresist serves mainly to protect the base layer 2 of the high-precision etching part, tracks for example; the second photoresist protects other parts, for example the metallized holes or the associated pads. The purpose of the first metallization operation is to deposit on the base metal 2, of copper for example, a layer of metal 5 outlining at least the patterns of the circuit elements requiring high-precision etching; this layer 5 constitutes a first photoresist. Next, the other circuit elements are made, notably the metallized holes (by drilling and metallizing, then recharging, i.e. metallizing a second time). During this phase, between the two metallization operations, the patterns 10 of the circuit elements of thick metal are made. Next, the second metallization operation is performed. During this second operation, the first metallic layer 5 is covered in part by another metallic layer 11 that also covers the other patterns of the circuit; this layer serves as a second photoresist. In this manner, we use two etching photoresists. The first, 5, protects the patterns of circuit to be etched with precision; the second, 11, protects the other circuit elements, for example the barrels of conducting holes or other elements requiring a large metal thickness. Note in particular that the internal surfaces of the holes are covered by the second photoresist 11, the drilling of the holes 7 having been carried out between the two operations of deposition of the metallic photoresists 5, 11. By drilling then metallizing the holes between the operations of creation of the two photoresist 5, 11 only the base layer 2 has to be etched, notably for the high-precision etchings. If, for example, the metallized holes were made before the first metallization operation, the layer 8 of metallization of the holes would be superposed on the base layer 2 including those zones requiring high-precision etching, where the overall thickness of the layers would be excessive, tending to reduce the etching precision. The etching is carried out after the deposit of the second photoresist 11. The two metals used as photoresists may be different to accommodate the finishes of the components, or may be identical.

Figure 11:
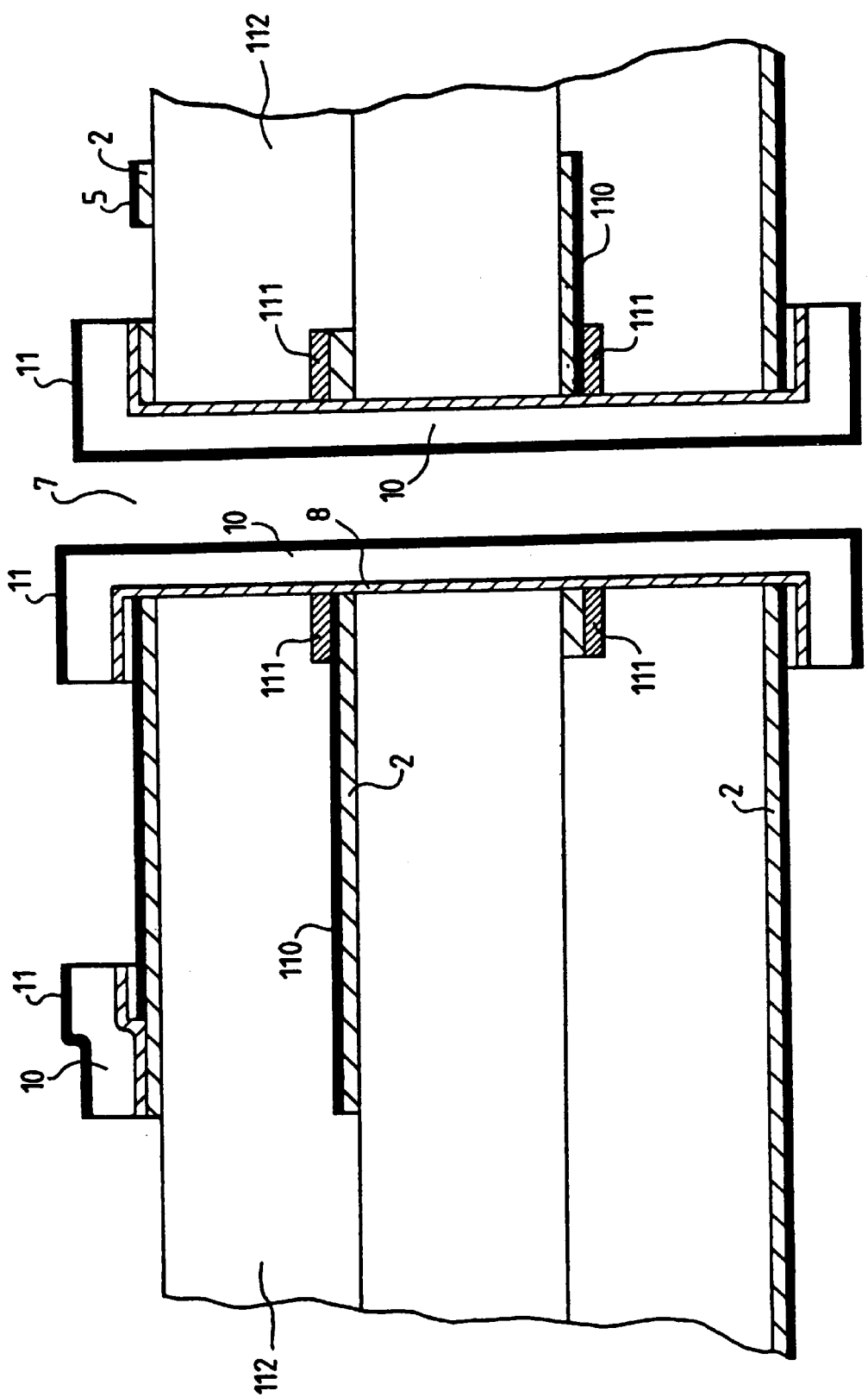
FIG. 11 shows an example of a multi-layer printed circuit board fabricated using the method according to the invention.

FIG. 11 shows an advantageous application of the method according to the invention. This application concerns the fabrication of a multi-layer printed circuit including, for example, internal lines 110 of imposed impedance, which requires very high etching precision. At the same time, to assure the reliability of the electric connections in the holes, pads 111 having large metal thickness are necessary at the interface of the lines and the conducting layer 8, 10, 11 of the holes 7, this large contact surface ensuring good electrical contact. In this case, the method according to the invention applied to each sub-layer 112 concerned provides for both etching precision for the tracks of imposed impedance and a satisfactory metal thickness for the pads assuring the connections via the holes.

The method according to the invention can also be applied to the fabrication of printed circuits providing digital functions, possible in association with microwave functions. More generally, the method can be applied to digital circuits (whose operating frequencies are tending to increase) since it enables the electric impedance of tracks to be perfectly controlled, and also since it is applicable to the multi-layer boards often required by such digital circuits owing to the very large number of interconnections involved. The method according to the invention also provides for mixing of several wiring technologies, for example by etching reserved component areas for components in classical packages with precision connecting lines, then making a second finish, adding metal where necessary notably for surface-mounted components. In the same manner, the method according to the invention can be used with so-called "chip on board" technology in which the chips are directly wired on the printed circuit using traditional wiring technology for classical and/or surface-mounted components, again thanks to the possibility of combining surface elements requiring high-precision etching with surface elements requiring metal thickness, and the possibility of mixing two different finishes on any face of a circuit.

In the embodiment illustrated by FIGS. 1 to 10, the surface elements to etch with precision are embedded in that they have beneath them only the base copper 2; for this purpose, they are covered with a layer of gold 5 constituting the first photoresist. Although gold has been used to illustrate this embodiment, it is clear that other metals could be used, such as nickel or silver. Finally, considering the high level of fabrication reliability that it provides, the invention is easy to implement and is moreover applicable for all types of printed circuits, including double-face and multilayer boards.

What is claimed is:

1. In a method to fabricate a printed circuit having a surface plated with a base metal layer, the improvement comprising:

depositing a first metallic resist on said base metal layer to delimit at least patterns of circuit elements to be etched in a layer having a first thickness;

forming metallized holes in said plated surface after depositing said first metallic resist; and depositing a second metallic resist after forming said metallized holes to delimit at least patterns of circuit elements to be etched in a layer having a second thickness greater than said first thickness;

whereby more accurate etching in said layer having said first thickness compared to etching in said layer having said second thickness is possible.

2. The method according to claim 1, further comprising:

forming circuit patterns between depositing said first metallic resist and depositing said second metallic resist.

3. The method according to claim 2, wherein depositing said second metallic resist is performed so that said second metallic resist protects said patterns of the circuit elements to be etched in the layer having said second thickness.

4. The method according to claim 2, wherein depositing said second metallic resist is performed so that said second metallic resist covers said patterns of circuit elements to be etched in the layer having said second thickness.

5. The method according to claim 2, further comprising:

covering the patterns of the circuit elements to be etched in the layer having said first thickness and internal surfaces of the metallized holes with a layer of metal before forming said patterns of circuit elements to be etched in a layer having a second thickness.

6. The method according to claim 5, wherein covering patterns of the circuit elements to be etched in the layer having said first thickness and the internal surfaces of the metallized holes with said layer of metal comprises covering the patterns of the circuit elements to be etched in the layer having said first thickness and internal surfaces of the metallized holes with a layer of copper.

7. The method according to claim 2, further comprising:

depositing a protective product on the patterns of circuit elements to be etched in the layer having said second thickness;

depositing a metal on surfaces not covered by said protective product; and removing said protective product.

8. The method according to claim 7, wherein depositing said metal comprises electroplating copper.

9. The method according to claim 1, wherein depositing said second metallic resist comprises depositing gold.

10. The method according to claim 1, wherein depositing said second metallic resist comprises depositing a second metallic resist containing tin.

11. The method according to claim 1, wherein said base metal layer comprises copper.

12. The method according to claim 1, further comprising:

covering said first metallic resist with a copper layer.

13. The method according to claim 1, wherein depositing said first metallic resist comprises electroplating a metal on said base layer.

14. The method according to claim 1, wherein depositing said second metallic resist comprises electroplating a metal.

15. The method according to claim 1, wherein depositing said first metallic resist comprises depositing gold.

* * * * *